(12) United States Patent
Yim et al.

(10) Patent No.: US 8,659,048 B2
(45) Date of Patent: Feb. 25, 2014

(54) ORGANIC LIGHT EMITTING DEVICE

(75) Inventors: Sang-Hoon Yim, Yongin (KR); Ok-Keun Song, Yongin (KR); Young-Mo Koo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/442,682

(22) Filed: Apr. 9, 2012

(65) Prior Publication Data

US 2012/0292656 A1  Nov. 22, 2012

(30) Foreign Application Priority Data

May 17, 2011  (KR) .................... 10-2011-0046384

(51) Int. Cl.
*H01L 51/52* (2006.01)
(52) U.S. Cl.
USPC  257/99; 257/E33.001; 257/40; 257/E51.019; 438/22; 313/504; 313/506
(58) Field of Classification Search
USPC .............. 257/99, 40, 642–643, 759; 313/506, 313/504
See application file for complete search history.

(56) References Cited

U.S. PATENT DOCUMENTS

| 7,839,083 | B2 * | 11/2010 | Kubota ......................... 313/506 |
| 2006/0028124 | A1 * | 2/2006 | Chu et al. ...................... 313/504 |
| 2011/0068688 | A1 * | 3/2011 | Choi et al. ...................... 315/51 |
| 2011/0079815 | A1 * | 4/2011 | Yamada et al. ................. 257/99 |
| 2011/0248244 | A1 * | 10/2011 | Ali et al. ......................... 257/40 |

FOREIGN PATENT DOCUMENTS

| KR | 10-0683701 B1 | 2/2007 |
| KR | 10-2009-0016238 A | 2/2009 |
| KR | 10-2009-0045681 A | 5/2009 |
| KR | 10-0942562 B1 | 2/2010 |

* cited by examiner

*Primary Examiner* — Marcos D. Pizarro
*Assistant Examiner* — Quinton Brasfield
(74) *Attorney, Agent, or Firm* — Knobbe Martens Olson & Bear LLP

(57) ABSTRACT

An organic light emitting device includes a first electrode formed over a substrate, an intermediate layer that is formed over the first electrode and includes an organic light emitting layer, and a second electrode that includes a central electrode unit disposed in a central region and a peripheral electrode unit separated from the central electrode unit and disposed in a peripheral region. The intermediate layer is disposed between the first and second electrodes. The organic light emitting device can readily secure a uniform brightness characteristic.

20 Claims, 4 Drawing Sheets

ORGANIC LIGHT EMITTING DEVICE

CROSS-REFERENCE TO RELATED PATENT APPLICATION

This application claims the benefit of Korean Patent Application No. 10-2011-0046384, filed on May 17, 2011, in the Korean Intellectual Property Office, the disclosure of which is incorporated herein in its entirety by reference.

BACKGROUND

1. Field

The present disclosure relates to an organic light emitting device, and more particularly, to an organic light emitting device that provides uniform brightness.

2. Description of the Related Art

An organic light emitting device generates a visible light from an organic material disposed between two electrodes when a voltage is applied to the electrodes. The organic light emitting device is an emissive device and has various advantages.

Recent studies have been conducted using the organic light emitting devices for illumination purposes besides using the devices in conventional display apparatus.

An organic light emitting device generates visible light having relatively uniform brightness when the organic light emitting device having a small area is formed. However, when an organic light emitting device having a large area is formed, the brightness characteristic of the organic light emitting device differs from region to region. Therefore, there is a limit to securing a uniform brightness characteristic of the organic light emitting device.

SUMMARY

One aspect of the present invention provides an organic light emitting device that can readily secure a uniform brightness characteristic.

Another aspect of the present invention provides an organic light emitting device including: a first electrode formed over a substrate; an intermediate layer that is formed on the first electrode and includes an organic light emitting layer; and a second electrode that includes a central electrode unit disposed in a central region and a peripheral electrode unit separated from the central electrode unit and disposed in a peripheral region, wherein the intermediate layer is disposed between the first and second electrodes.

The central electrode unit and the peripheral electrode unit respectively may be connected to first and second power sources which are configured to control voltages applied to the central electrode unit and the peripheral electrode unit, respectively.

The voltage applied to the peripheral electrode unit may be higher than that applied to the central electrode unit.

The first electrode may be formed as a single body.

The first electrode may be connected to electrode voltage application units and a voltage may be applied to edges of the first electrode via the electrode voltage application units.

The electrode voltage application units may be formed on the edges of the first electrode.

The central electrode unit may have at least an edge which has a curved portion.

The center of the first electrode may coincide with the center of the central electrode unit.

The center of the central electrode unit may coincide with the center of the peripheral electrode unit.

The organic light emitting device may further include electrode voltage application units formed to apply voltages to the electrode units of the second electrode, respectively, wherein the first electrode includes a recess portion recessed from an edge of the first electrode, and the recess portion is formed to overlap the electrode voltage application units which are to apply voltages to the second electrode.

The second electrode further comprises at least an additional peripheral electrode unit, wherein the peripheral electrode unit may be disposed to surround the central electrode unit, and wherein the at least an additional electrode unit may be disposed to surround the peripheral electrode unit disposed to surround the central electrode unit.

The electrode units respectively may be connected to power sources which are configured to control voltages applied to the electrode units, respectively.

When a first one of the electrode units is disposed farther from the center of the second electrode than a second one of the electrode units, the voltage applied to the first electrode unit may be higher than that applied to the second electrode unit.

The centers of the electrode units may be formed to coincide with each other.

Edges of at least some of the electrode units may have curved portions.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings in which embodiments of the invention are shown.

Figure 1:
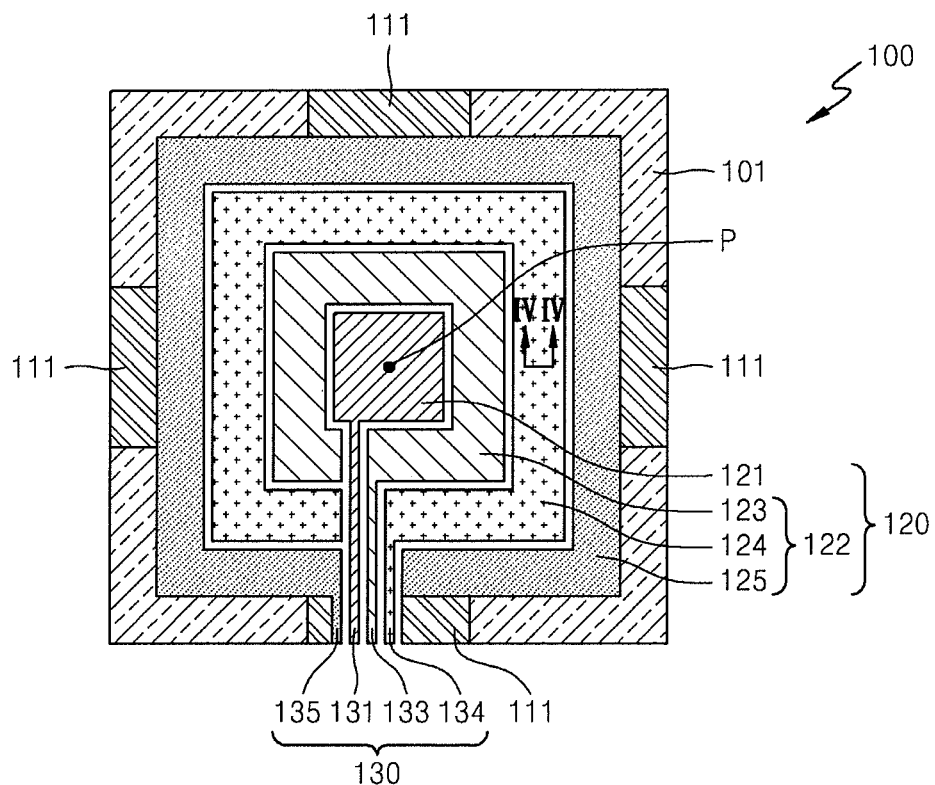
FIG. 1 is a schematic plan view of an organic light emitting device according to an embodiment of the present invention.
Figure 2:
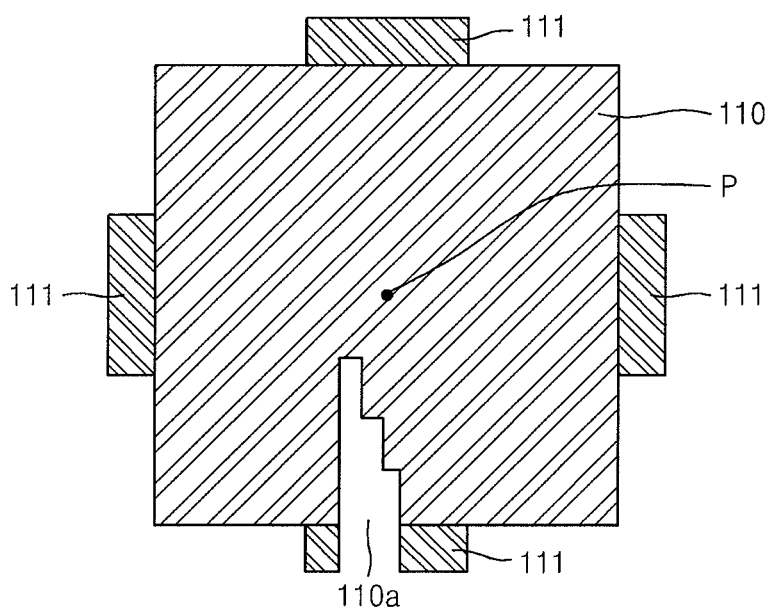
FIG. 2 is a schematic plan view of a first electrode of the organic light emitting device of FIG. 1, according to an embodiment of the present invention.
Figure 3:
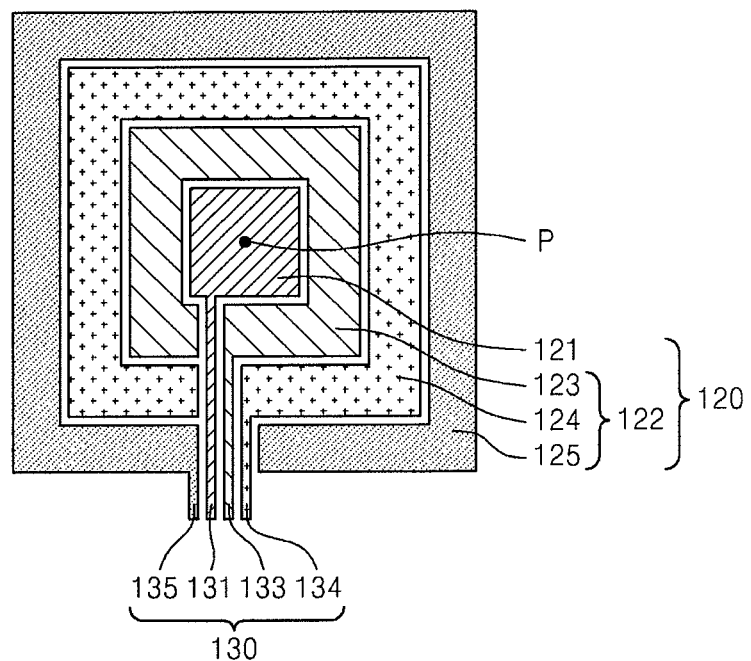
FIG. 3 is a schematic plan view of a second electrode of the organic light emitting device of FIG. 1, according to an embodiment of the present invention.
Figure 4:
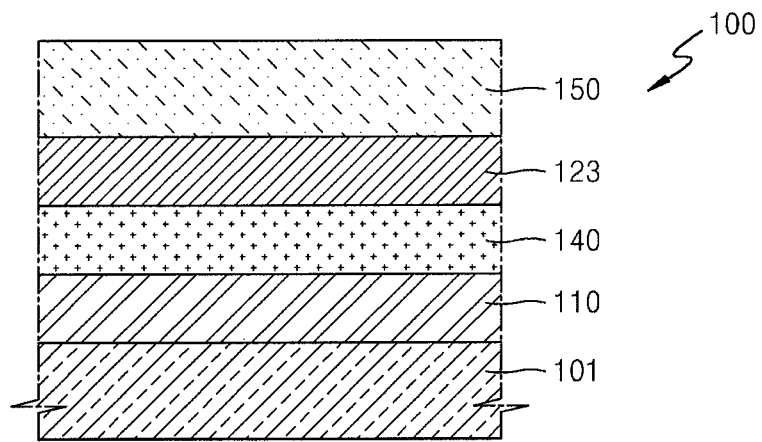
FIG. 4 is a cross-sectional view taken along the line IV-IV of FIG. 1.

FIG. 1 is a schematic plan view of an organic light emitting device 100 according to an embodiment of the present invention. FIG. 2 is a schematic plan view of a first electrode of the organic light emitting device 100 of FIG. 1, according to an embodiment of the present invention. FIG. 3 is a schematic plan view of a second electrode of the organic light emitting device 100 of FIG. 1, according to an embodiment of the present invention. FIG. 4 is a cross-sectional view taken along the line IV-IV of FIG. 1;

Referring to FIGS. 1 through 4, the organic light emitting device 100 includes a substrate 101, a first electrode 110, an intermediate layer 140, and a second electrode 120. The second electrode 120 includes a central electrode unit 121 and a peripheral electrode unit 122.

Now, each of the members will be practically described.

The substrate 101 may be formed of a transparent glass material that includes $SiO_2$ as the main component. The substrate 101 according to the current embodiment is not limited thereto, and may be formed of a plastic material. The plastic material that can be used to form the substrate 101 may be an organic material selected from the group consisting of polyethersulphone (PES), polyacrylate (PAR), polyetherimide (PEI), polyethyelenen napthalate (PEN), polyethyelene-terepthalate PET), polyphenylene sulfide (PPS), polyallylate, polyimide, poly carbonate (PC), cellulose triacetate (TAC), and cellulose acetate propionate (CAP).

The first electrode 110 is formed on the substrate 101. Although not shown, a buffer layer (not shown) may be formed between the substrate 101 and the first electrode 110. The buffer layer provides a planarized surface on the substrate 101 and inhibits moisture and foreign materials from penetrating into the substrate 101. The buffer layer may be formed of an insulating material.

The first electrode 110 is an anode electrode and may be formed of various conductive materials. For example, the first electrode 110 may include indium tin oxide (ITO).

For convenience of explanation, the first electrode 110 is more practically depicted in FIG. 2. Referring to FIG. 2, the first electrode 110 is not divided by a plurality of regions but is formed as one body. The first electrode 110 has a shape similar to a square. The first electrode 110 includes a groove shaped recessed portion 110a on a surface thereof. That is, the recessed portion 110a is a region where a voltage is not applied when the voltage is applied to the first electrode 110, and thus, a visible light is not generated from the intermediate layer 140 corresponding to the recessed portion 110a.

A first electrode voltage application structure includes four electrode voltage application units 111 are formed on four sides of the first electrode 110 to apply a voltage to the first electrode 110. An identical voltage is applied to the four electrode voltage application units 111. For this purpose, one common power source (not shown) may be connected to the four electrode voltage application units 111. More specifically, the four electrode voltage application units 111 may be connected to each other by a rim unit (not shown).

When a voltage is applied to the first electrode 110, a relatively low voltage may be applied to the center P of the first electrode 110 due to a voltage drop (IR drop) because the center P is the farthest point from the electrode voltage application units 111. That is, since the voltage is applied from the sides of the first electrode 110 that is formed as one body having a large area, a voltage which is relatively lower than that applied to regions adjacent to the electrode voltage application units 111 is applied to the center P located remotely from the sides.

In particular, when the first electrode 110 is formed of a material having a low electrical conductivity like ITO, the voltage drop may further occur, and thus, a voltage that is applied to the center P may be apparently lower than that applied to the side regions adjacent to the electrode voltage application units 111.

The intermediate layer 140 is formed on the first electrode 110. The intermediate layer 140 includes an organic light emitting layer (not shown) that emits visible light when a voltage is applied through the first and second electrodes 110 and 120. The intermediate layer 140 may facilitate the transmission of charges, and for the effective generation of visible light, may include at least one layer selected from the group consisting of a hole injection layer (HIL), a hole transport layer (HTL), an electron transport layer (ETL), and an electron injection layer (EIL) or a plurality of layers.

The second electrode 120 is formed on the intermediate layer 140. For convenience of explanation, the second electrode 120 is more practically depicted in FIG. 3. A second electrode voltage application structure 130 is connected to the second electrode 120 to apply to a voltage to the second electrode 120.

The second electrode 120 includes the central electrode unit 121 and the peripheral electrode unit 122. The peripheral electrode unit 122 includes a first peripheral electrode unit 123, a second peripheral electrode unit 124, and a third peripheral electrode unit 125. However, the present invention is not limited thereto and the peripheral electrode unit 122 may be one or more than three.

The second electrode voltage application structure 130 includes a central electrode unit voltage application unit 131, a first peripheral electrode voltage application unit 133, a second peripheral electrode voltage application unit 134, and a third peripheral electrode voltage application unit 135.

The central electrode unit 121 is disposed in the center of the second electrode 120. The center P of the second electrode 120 coincides with the center P of the central electrode unit 121. The center P of the second electrode 120 and the center P of the first electrode 110 are the same point.

In order to apply a voltage to the central electrode unit 121, the central electrode unit voltage application unit 131 extends to reach a lower side of the central electrode unit 121 and is connected to the central electrode unit 121. Although not shown, a power source is connected to an end of the central electrode unit voltage application unit 131.

The first peripheral electrode unit 123 is disposed peripherally to the central electrode unit 121 to surround the central electrode unit 121. Also, the first peripheral electrode unit 123 is separated from the central electrode unit 121 and the central electrode unit voltage application unit 131.

In order to apply a voltage to the first peripheral electrode unit 123, the first peripheral electrode voltage application unit 133 extends to reach a lower side of the first peripheral electrode unit 123 and is connected to the first peripheral electrode unit 123. Although not shown, a power source may be connected to an end of the first peripheral electrode voltage application unit 133. The first peripheral electrode voltage application unit 133 is separated from the central electrode unit voltage application unit 131.

Also, the center P of the first peripheral electrode unit 123 coincides with the center P of the central electrode unit 121.

The second peripheral electrode unit 124 is disposed peripherally to the first peripheral electrode unit 123 to surround the first peripheral electrode unit 123. The second peripheral electrode unit 124 is separated from the first peripheral electrode unit 123 and the first peripheral electrode voltage application unit 133. Of course, the second peripheral electrode unit 124 is separated from the central electrode unit 121 and the central electrode unit voltage application unit 131.

In order to apply a voltage to the second peripheral electrode unit 124, the second peripheral electrode voltage application unit 134 extends to reach a lower side of the second peripheral electrode unit 124 and is connected to the second peripheral electrode unit 124. Although not shown, a power source may be connected to an end of the second peripheral electrode voltage application unit 134. The second peripheral electrode voltage application unit 134 is separated from the central electrode unit voltage application unit 131 and the first peripheral electrode voltage application unit 133.

The center P of the second peripheral electrode unit 124 coincides with the center P of the central electrode unit 121.

The third peripheral electrode unit 125 is disposed peripherally to the second peripheral electrode unit 124 to surround the second peripheral electrode unit 124. The third peripheral electrode unit 125 is separated from the second peripheral electrode unit 124 and the second peripheral electrode voltage application unit 134. Of course, the third peripheral electrode unit 125 is separated from the central electrode unit 121, the central electrode unit voltage application unit 131, the first peripheral electrode unit 123, and the first peripheral electrode voltage application unit 133.

In order to apply a voltage to the third peripheral electrode unit 125, the third peripheral electrode voltage application unit 135 extends to reach a lower side of the third peripheral electrode unit 125 and is connected to the third peripheral electrode unit 125. Although not shown, a power source may be connected to the third peripheral electrode voltage application unit 135. The third peripheral electrode voltage application unit 135 is separated from the central electrode unit voltage application unit 131, the first peripheral electrode voltage application unit 133, and the second peripheral electrode voltage application unit 134.

Also, the center P of the third peripheral electrode unit 125 coincides with the center P of the central electrode unit 121.

Through the above configuration, voltages applied to the central electrode unit 121, the first peripheral electrode unit 123, the second peripheral electrode unit 124, the third peripheral electrode unit 125 may be individually controlled. Also, voltages different from each other may be applied to the central electrode unit 121, the first peripheral electrode unit 123, the second peripheral electrode unit 124, and the third peripheral electrode unit 125. For example, gradually increasing voltages may be sequentially applied to the central electrode unit 121, the first peripheral electrode unit 123, the second peripheral electrode unit 124, and the third peripheral electrode unit 125, which will be described later.

As described above, the first electrode 110 has the recessed portion 110a. The recessed portion 110a is formed to correspond to the central electrode unit voltage application unit 131, the first peripheral electrode voltage application unit 133, the second peripheral electrode voltage application unit 134, and the third peripheral electrode voltage application unit 135. That is, the recessed portion 110a is formed to correspond to the second electrode voltage application structure 130 that applies a voltage to the second electrode 120.

A sealing member 150 protects the first electrode 110, the intermediate layer 140, and the second electrode 120 from external moisture or oxygen. The sealing member 150 may be formed of various materials, and more practically, may be formed of a glass material or a plastic material. Also, even though the sealing member 150 is depicted to contact the second electrode 120, the sealing member 150 may be separated from the second electrode 120.

Figure 5:
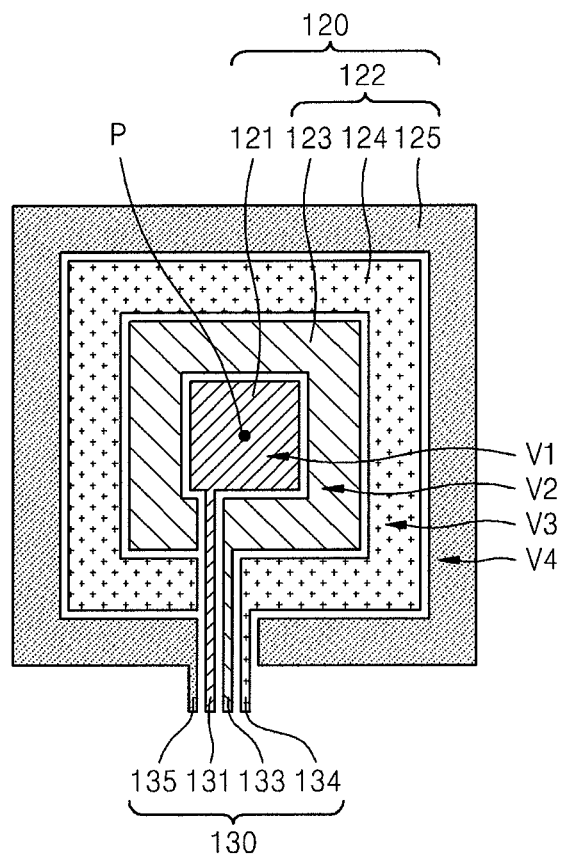
FIGS. 5 and 6 are schematic drawings showing voltage differences in regions of the first and second electrodes when a voltage is applied to the first and second electrodes of the organic light emitting device of FIG. 1.
Figure 5:
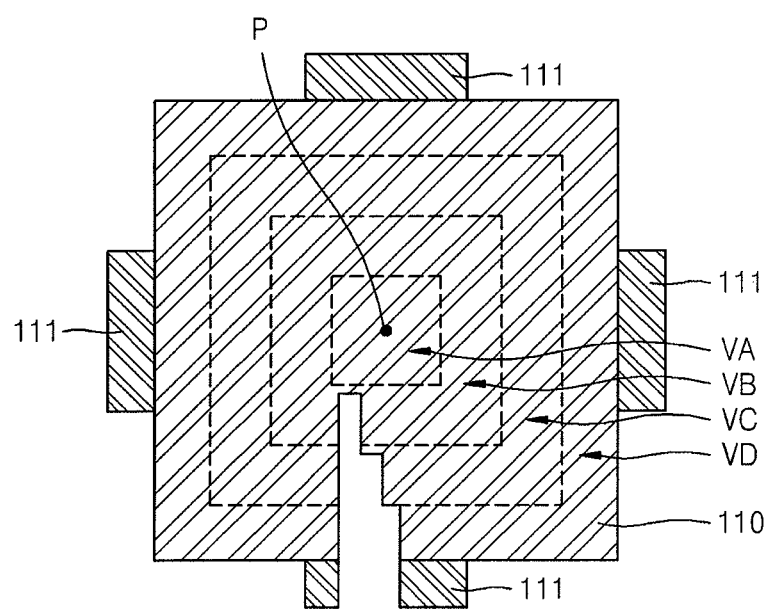
Figure 6:
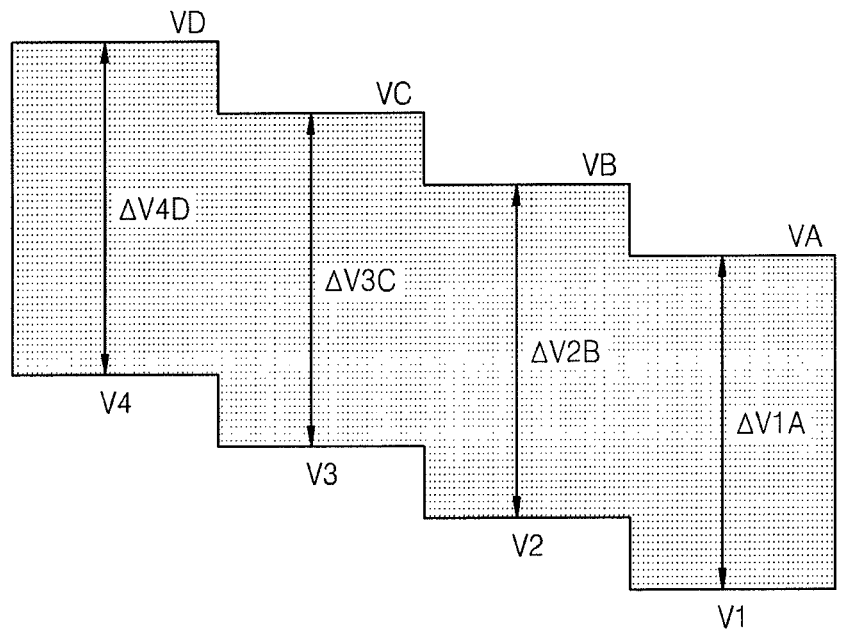

FIGS. 5 and 6 are schematic drawings showing voltage differences in regions of the first and second electrodes 110 and 120 when a voltage is applied to the first and second electrodes 110 and 120 of the organic light emitting device 100 of FIG. 1.

That is, FIGS. 5 and 6 show an operation of the organic light emitting device 100 to generate a visible light from the intermediate layer 140 by applying voltages to the first electrode 110 and the second electrode 120.

Referring to the drawing on the left side in FIG. 5, voltages applied to each of the regions of the second electrode 120 are depicted. More specifically, voltages V1, V2, V3, and V4 are respectively applied to the central electrode unit 121, the first peripheral electrode unit 123, the second peripheral electrode unit 124, and the third peripheral electrode unit 125. At this point, values of the V1, V2, V3, and V4 are V4>V3>V2>V1. For this purpose, the central electrode unit voltage application unit 131 and the first through third peripheral electrode voltage application units 133 through 135 of the second electrode voltage application structure 130 are connected to power sources that are separate from each other to supply voltages that are different from each other to the central electrode unit 121 and the first through third peripheral electrode units 123 through 125 of the second electrode 120.

Referring to the drawing on the right side in FIG. 5, voltages applied to each of the regions of the first electrode 110 are depicted. More specifically, voltages VA, VB, VC, and VD are respectively applied to the central region of the first electrode 110, that is, a region corresponding to the central electrode unit 121 of the second electrode 120, a region of the first electrode 110 that corresponds to the first peripheral electrode unit 123, a region of the first electrode 110 that corresponds to the second peripheral electrode unit 124, and a region of the first electrode 110 that corresponds to the third peripheral electrode unit 125.

As described above, since the first electrode 110 is formed as one body, basically a uniform voltage may be applied to the entire region of the first electrode 110 when a voltage is applied to the first electrode 110. This is particularly important since the electrode voltage application units 111 are disposed on edges of the first electrode 110. However, in practice, since the area of the first electrode 110 is large, a voltage drop (IR drop) occurs. Specifically, when a first portion of the first electrode is disposed farther from the electrode voltage application units 111 of the first electrode 110 than a second portion of the first electrode, the voltage drop at the first portion is greater than that at the second portion, and thus, the value of voltage at the first portion is smaller than that at the second portion.

As a result, although a uniform voltage is applied to the electrode voltage application units 111 through a single power source, the values of the voltages being applied to each of the regions of the first electrode 110 may vary, that is, the values of the voltages are in the order of VD>VC>VB>VA. At this point, since the first electrode 110 includes ITO having a relatively high resistance instead of a metal having a relatively low resistance, the voltage drop in each of the regions of the first electrode 110 may more severely occur, and accordingly, the voltage difference between VA and VD may be apparently increased.

FIG. 6 shows voltage differences between regions of the first electrode 110 and regions of the second electrode 120 corresponding to the regions of the first electrode 110.

More specifically, a voltage difference between a voltage V1 applied to the central electrode unit 121 of the second electrode 120 and a voltage VA applied to a region of the first electrode 110 corresponding to the central electrode unit 121 of the second electrode 120 is defined as ΔV1A; a voltage difference between a voltage V2 applied to the first peripheral electrode unit 123 of the second electrode 120 and a voltage VB applied to a region of the first electrode 110 corresponding to the first peripheral electrode unit 123 of the second electrode 120 is defined as ΔV2B; a voltage difference between a voltage V3 applied to the second peripheral electrode unit 124 of the second electrode 120 and a voltage VC applied to a region of the first electrode 110 corresponding to the second peripheral electrode unit 124 of the second electrode 120 is defined as ΔV3C; and a voltage difference between a voltage V4 applied to the third peripheral electrode unit 125 of the second electrode 120 and a voltage VD applied to a region of the first electrode 110 corresponding to the third peripheral electrode unit 125 of the second electrode 120 is defined as ΔV4D.

In one embodiment, the voltage differences ΔV1A, ΔV2B, ΔV3C, and ΔV4D are controlled to be substantially equal to each other. In another embodiment, the voltage differences ΔV1A, ΔV2B, ΔV3C, and ΔV4D are controlled such that difference between two among the voltage differences ΔV1A, ΔV2B, ΔV3C, and ΔV4D is smaller than a predetermined value.

That is, as described above, since the voltages VA, VB, VC, and VD applied to the first electrode 110 are sequentially increased, voltages V1, V2, V3, and V4 applied to the regions of the second electrode 120 are also controlled to be sequentially increased.

In an example of an organic light emitting device, when an organic light emitting device is used as an illumination device, the area of a first electrode increases, and the voltage drop problem also increases. Therefore, it is not easy to secure a uniform brightness on an entire region of the organic light emitting device. Also, in order to address the voltage drop problem, an auxiliary electrode is additionally formed on the first electrode. However, problems of process complexity, process failure, increase in costs, and increase in the process time occur as well.

However, in the organic light emitting device 100 according to embodiments of the present invention, although a voltage drop occurs in the first electrode 110, since different voltages are respectively applied to the central electrode unit 121 of the second electrode 120, the first peripheral electrode unit 123, the second peripheral electrode unit 124, and the third peripheral electrode unit 125, a uniform voltage gap between the first electrode 110 and the second electrode 120 can be maintained over the entire region of the organic light emitting device 100.

Through the above method, it is possible to secure a uniform brightness over the entire region of the organic light emitting device 100. As a result, it is possible to readily manufacture an illumination device having a high brightness characteristic.

Also, in the current embodiment, the recessed portion 110a is formed to correspond to the second electrode voltage application structure 130. That is, different voltages are respectively applied to the central electrode unit voltage application unit 131, the first peripheral electrode voltage application unit 133, the second peripheral electrode voltage application unit 134, and the third peripheral electrode voltage application unit 135, and thus, an abnormal light emission phenomenon occurs at a position corresponding to the second electrode voltage application structure 130. However, in the current embodiment, a voltage is not applied to the recessed portion 110a through the first electrode 110 since the recessed portion 110a is formed in the first electrode 110. Therefore, light emission does not occur from the intermediate layer 140, and as a result, an abnormal light emission is fundamentally blocked.

Figure 7:
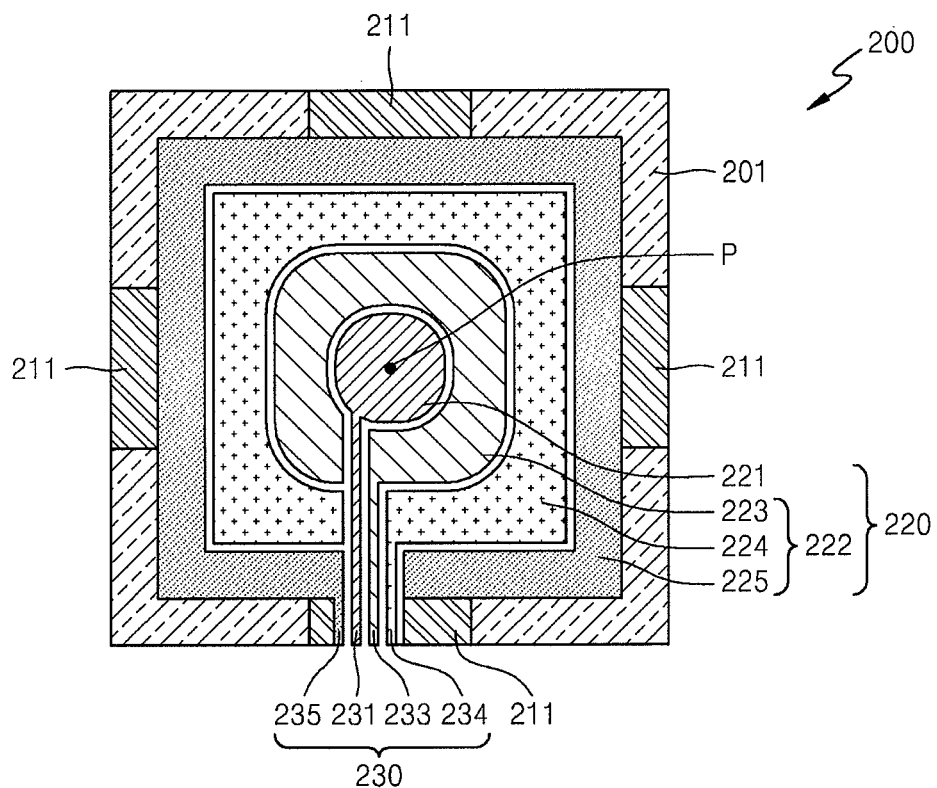
FIG. 7 is a schematic plan view of an organic light emitting device according to another embodiment of the present invention.

FIG. 7 is a schematic plan view of an organic light emitting device 200 according to another embodiment of the present invention. For convenience of explanation, differences from the previous embodiment will be mainly described.

The organic light emitting device 200 includes a substrate 201, a first electrode (not shown), an intermediate layer (not shown), and a second electrode 220. The second electrode 220 includes a central electrode unit 221 and a peripheral electrode unit 222. The peripheral electrode unit 222 includes a first peripheral electrode unit 223, a second peripheral electrode unit 224, and a third peripheral electrode unit 225.

However, the present invention is not limited thereto, that is, organic light emitting device 200 may include one or more than three peripheral electrode units 222.

Four first electrode voltage application units 211 are connected to the first electrode (not shown) to apply a voltage to the first electrode (not shown). An identical voltage is applied to the four first electrode voltage application units 211. For this purpose, one common power source (not shown) may be connected to the four first electrode voltage application units 211.

The second electrode voltage application structure 230 is connected to the second electrode 220 to apply a voltage to the second electrode 220. The second electrode voltage application structure 230 includes a central electrode unit voltage application unit 231, a first peripheral electrode voltage application unit 233, and a second peripheral electrode voltage application unit 234, and a third peripheral electrode voltage application unit 235.

Edges of the central electrode unit 221 of the second electrode 220 have curved lines. Also, edges of the first peripheral electrode unit 223 have curved lines.

When a voltage is applied to the first electrode (not shown) through the first electrode voltage application units 211, as described above, a voltage drop strongly occurs in each region of the first electrode formed as one body. That is, the values of voltages applied towards the center P from regions adjacent to the first electrode voltage application units 211 of the first electrode are gradually reduced. Also, at this time, due to the voltage drop, boundary lines between the regions of the first electrode where the voltage is different may be curved. That is, a boundary line between the central electrode unit 221 of the second electrode 220 and the first peripheral electrode unit 223 may be formed as a curved line to effectively reflect the voltage drop of the first electrode.

However, the current embodiment is not limited thereto, that is, a single boundary line between the central electrode unit 221 and the first peripheral electrode unit 223 may be formed as a curved line. Also, boundary lines of the second peripheral electrode unit 224 may also be formed as curved lines.

While embodiments of the present invention have been particularly shown and described, it will be understood by those of ordinary skill in the art that various changes in form and details may be made therein without departing from the spirit and scope of the present invention as defined by the following claims.

What is claimed is:

1. An organic light emitting device comprising:
   a first electrode formed over a substrate which has a major surface;
   a second electrode that comprises a central electrode section disposed in a central region and a peripheral electrode section separated from the central electrode section and disposed in a peripheral region when viewed in a direction perpendicular to the major surface, wherein the peripheral electrode section surrounds the central electrode section when viewed in the direction; and
   an intermediate layer disposed between the first electrode and the second electrode, the intermediate layer comprising an organic light emitting layer.

2. The organic light emitting device of claim 1, wherein the central electrode section and the peripheral electrode section respectively are connected to first and second power sources which are configured to control voltages applied to the central electrode section and the peripheral electrode section, respectively.

3. The organic light emitting device of claim 1, wherein the voltage applied to the peripheral electrode section is higher than that applied to the central electrode section.

4. The organic light emitting device of claim 1, wherein the first electrode is formed as a single body.

5. The organic light emitting device of claim 1, wherein the central electrode section comprises at least an edge which comprises a curved portion.

6. The organic light emitting device of claim 1, wherein the center of the first electrode coincides with the center of the central electrode section.

7. The organic light emitting device of claim 1, wherein the center of the central electrode section coincides with the center of the peripheral electrode section.

8. The organic light emitting device of claim 1, further comprising electrode voltage application lines formed to apply voltages to the central and peripheral electrode sections of the second electrode, respectively, wherein the first electrode comprises a recess portion recessed from an edge of the first electrode, and the recess portion is formed to overlap the electrode voltage application lines when viewed in the direction.

9. The organic light emitting device of claim 1, further comprising an electric voltage application line connected to the central electrode section and configured to apply an electric voltage to the central electrode section, wherein the peripheral electrode section comprises an opened channel through which the electric voltage application line passes when viewed in the direction.

10. The organic light emitting device of claim 1, wherein the first electrode comprises a recess portion recessed from an edge of the first electrode, and the recess portion overlaps the opened channel when viewed in the direction.

11. The organic light emitting device of claim 1, wherein the first electrode comprises a first region and a second region when viewed in the direction,
wherein the first and second regions overlap the central and peripheral electrode sections overlaps, respectively, when viewed in the direction,
wherein a voltage difference between the first region and the central electrode section is substantially equal to that between the second region and the peripheral electrode section.

12. The organic light emitting device of claim 1, wherein the first electrode is connected to electrode voltage application units and a voltage is applied to edges of the first electrode via the electrode voltage application units.

13. The organic light emitting device of claim 12, wherein the electrode voltage application units are formed on the edges of the first electrode, respectively.

14. An organic light emitting device comprising:
a first electrode formed over a substrate which has a major surface;
a second electrode that comprises a central electrode section disposed in a central region and a peripheral electrode section separated from the central electrode section and disposed in a peripheral region when viewed in a direction perpendicular to the major surface; and
an intermediate layer disposed between the first electrode and the second electrode, the intermediate layer comprising an organic light emitting layer,
wherein the second electrode further comprises at least one additional peripheral electrode section,
wherein the peripheral electrode section is disposed to surround the central electrode section, and
wherein the at least one additional peripheral electrode section is disposed to surround the peripheral electrode section disposed to surround the central electrode section.

15. The organic light emitting device of claim 14, wherein the central electrode section, the peripheral electrode section and the at least one additional peripheral electrode section respectively are connected to power sources which are configured to control voltages applied to the central electrode section, the peripheral electrode section and the at least one additional peripheral electrode section, respectively.

16. The organic light emitting device of claim 14, wherein a first one of the central electrode section, the peripheral electrode section and the at least one additional peripheral electrode section is disposed farther from the center of the second electrode than a second one of the central electrode section, the peripheral electrode section and the at least one additional peripheral electrode section, and wherein the voltage applied to the first one of the central electrode section, the peripheral electrode section and the at least one additional peripheral electrode section is higher than that applied to the second one of the central electrode section, the peripheral electrode section and the at least one additional peripheral electrode section.

17. The organic light emitting device of claim 14, wherein the centers of the central electrode section, the peripheral electrode section and the at least one additional peripheral electrode section coincide with each other.

18. The organic light emitting device of claim 14, wherein edges of at least some of the central electrode section, the peripheral electrode section and the at least one additional peripheral electrode section comprise curved portions.

19. The organic light emitting device of claim 14, further comprising:
a first electric voltage application line connected to the central electrode section and configured to apply an electric voltage to the central electrode section; and
a second electric voltage application line connected to the peripheral electrode section and configured to apply an electric voltage to the peripheral electrode section,
wherein the peripheral electrode section comprises an opened channel through which the first electric voltage application line passes when viewed in the direction,
wherein the at least one additional peripheral electrode section comprises an opened channel through which the first and second electric voltage application lines pass when viewed in the direction.

20. The organic light emitting device of claim 19, wherein the first electrode comprises a recess portion recessed from an edge of the first electrode, wherein the recess portion overlaps the opened channels of the peripheral electrode section and the at least one additional peripheral electrode section when viewed in the direction.

* * * * *